US010522331B2

(12) United States Patent
Ohgoshi et al.

(10) Patent No.: US 10,522,331 B2
(45) Date of Patent: *Dec. 31, 2019

(54) PLASMA PROCESSING APPARATUS

(71) Applicant: HITACHI HIGH-TECHNOLOGIES CORPORATION, Tokyo (JP)

(72) Inventors: Yasuo Ohgoshi, Kudamatsu (JP); Michikazu Morimoto, Kudamatsu (JP); Yuuzou Oohirabaru, Kudamatsu (JP); Tetsuo Ono, Kudamatsu (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 346 days.

This patent is subject to a terminal disclaimer.

(21) Appl. No.: 15/333,669

(22) Filed: Oct. 25, 2016

(65) Prior Publication Data
US 2017/0040143 A1    Feb. 9, 2017

Related U.S. Application Data

(62) Division of application No. 13/742,409, filed on Jan. 16, 2013, now Pat. No. 9,514,967.

(30) Foreign Application Priority Data

Jul. 17, 2012  (JP) ................................ 2012-158255

(51) Int. Cl.
*H01J 37/32*  (2006.01)
*H01L 21/67*  (2006.01)
*H01L 21/3065*  (2006.01)

(52) U.S. Cl.
CPC .. *H01J 37/32146* (2013.01); *H01J 37/32174* (2013.01); *H01J 37/32192* (2013.01);
(Continued)

(58) Field of Classification Search
USPC ........................................ 156/345.24–345.28
See application file for complete search history.

(56) References Cited

U.S. PATENT DOCUMENTS

| 5,997,687 A | 12/1999 | Koshimizu |
| 6,586,887 B1 | 7/2003 | Oogoshi et al. |

(Continued)

FOREIGN PATENT DOCUMENTS

| JP | H02-105413 A | 4/1990 |
| JP | H02-129375 A | 5/1990 |

(Continued)

OTHER PUBLICATIONS

Office Action, dated Jun. 30, 2015, which issued during the prosecution of Japanese Patent Application No. 2012-158255, which corresponds to the present application (partial translation attached).
(Continued)

*Primary Examiner* — Rakesh K Dhingra
(74) *Attorney, Agent, or Firm* — Baker Botts L.L.P.

(57) ABSTRACT

A plasma processing apparatus includes a processing chamber for processing a sample with a plasma, an RF power supply for generating the plasma within the processing chamber, an RF bias power supply for supplying RF bias power to a sample stage on which the sample is mounted, a pulse generation unit for creating first pulses for modulating the output from the RF power supply for generating the plasma and second pulses for modulating the output from the RF bias power supply, and a controller for providing control of the processing of the sample with the sample. The pulse generation unit creates the first pulses and the second pulses synchronized based on a pulse delay time transmitted from the controller. The pulse delay time is established to delay the second pulses relative to the first pulses.

2 Claims, 8 Drawing Sheets

(52) U.S. Cl.
CPC .. *H01J 37/32706* (2013.01); *H01J 37/32935* (2013.01); *H01L 21/3065* (2013.01); *H01L 21/67069* (2013.01); *H01J 2237/327* (2013.01); *H01J 2237/334* (2013.01)

(56) References Cited

U.S. PATENT DOCUMENTS

| | | |
|---|---|---|
| 2004/0124177 A1 | 7/2004 | Urban et al. |
| 2005/0241762 A1 | 11/2005 | Paterson et al. |
| 2009/0284156 A1 | 11/2009 | Banna et al. |
| 2010/0130018 A1 | 5/2010 | Tokashiki et al. |
| 2010/0276391 A1 | 11/2010 | Grimbergen et al. |
| 2010/0330299 A1 | 12/2010 | Moon et al. |
| 2011/0031216 A1 | 2/2011 | Liao et al. |

FOREIGN PATENT DOCUMENTS

| | | |
|---|---|---|
| JP | H04-174514 A | 6/1992 |
| JP | H05-39578 A | 2/1993 |
| JP | H08-83776 A | 3/1996 |
| JP | 8-250479 A | 9/1996 |
| JP | H10-107012 A | 4/1998 |
| JP | 2000-311890 A | 11/2000 |
| JP | 2010-238960 A | 10/2010 |

OTHER PUBLICATIONS

English Machine Translation JP2000311890, Boku et al dated Nov. 7, 2000.

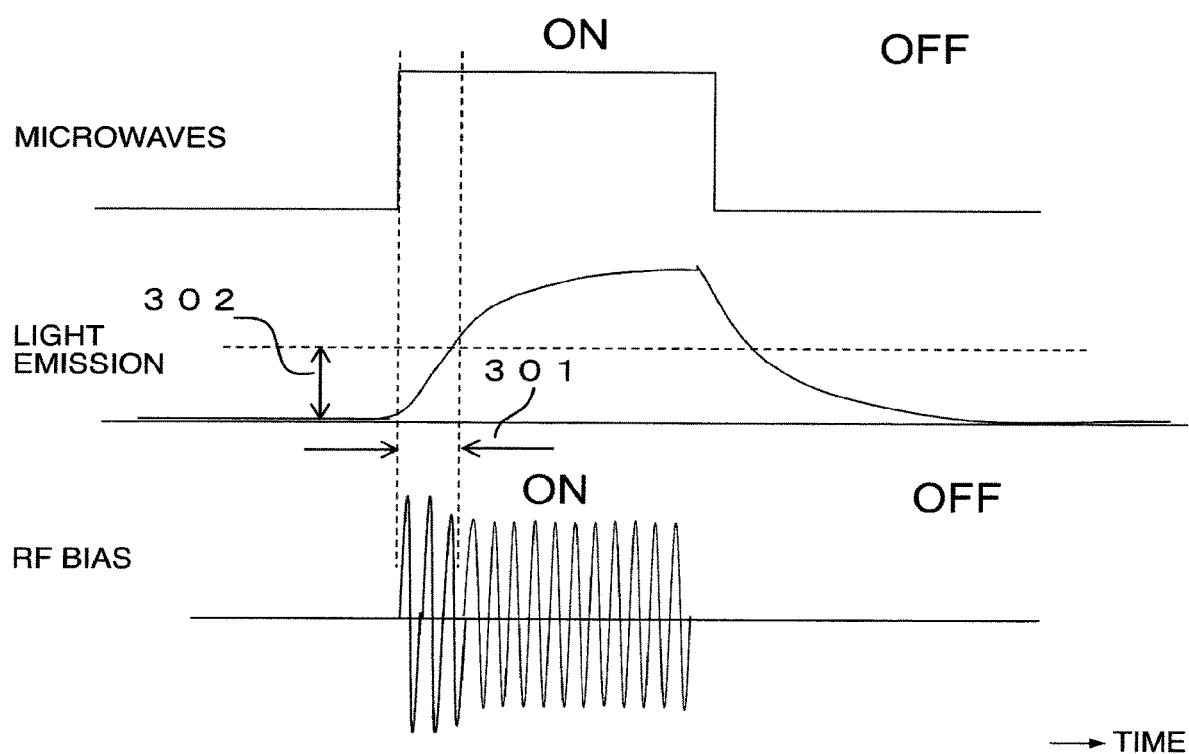

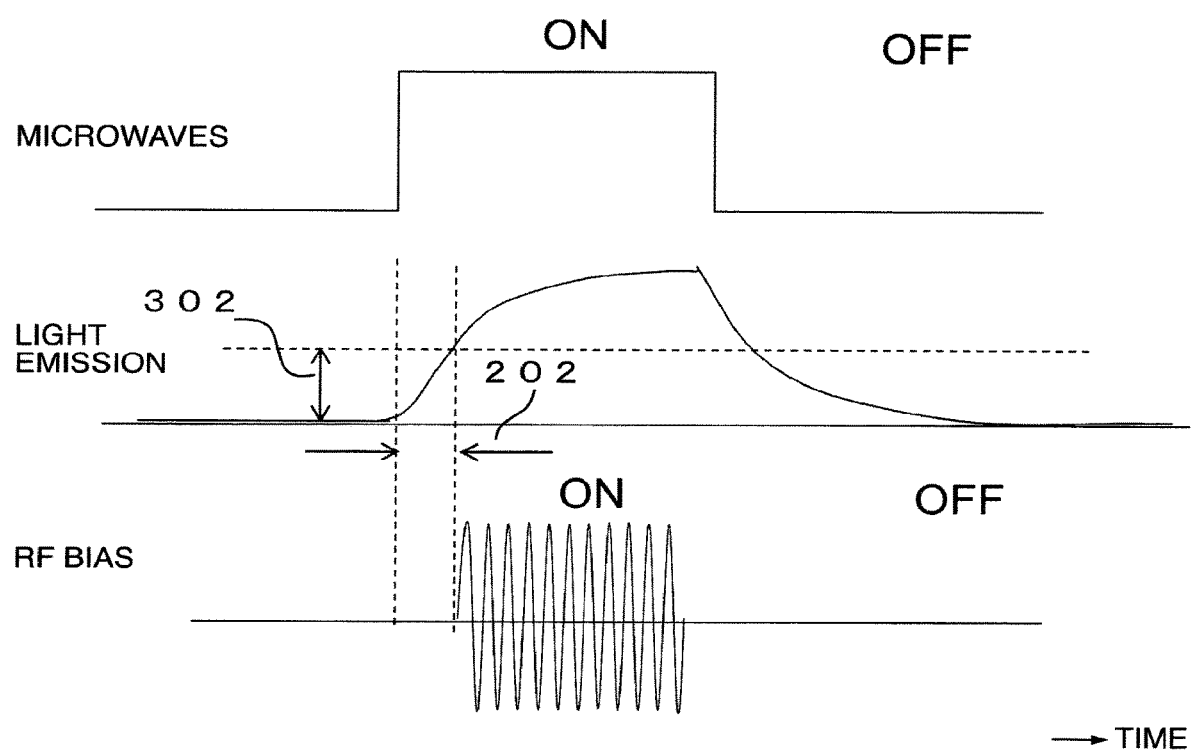

PLASMA PROCESSING APPARATUS

CROSS REFERENCE TO RELATED APPLICATIONS

The present application is a divisional application of U.S. patent application Ser. No. 13/742,409 filed on Jan. 16, 2013, which claims priority from Japanese application JP2012-158255 filed on Jul. 17, 2012, the contents of all of which are hereby incorporated by reference into this application.

BACKGROUND OF THE INVENTION

The present invention relates to a plasma processing apparatus and, more particularly, to a plasma processing apparatus adapted to accurately etch fine patterns by applying an RF (radio frequency) bias to samples such as semiconductor devices while using a plasma in order to process the samples.

Today, it is becoming important to control reaction products generated during etching in order to process the surfaces of semiconductor devices accurately. A method for controlling reaction products using a plasma and time modulation of a bias is disclosed as a conventional method in JP-A-8-250479.

Generally, in the case of a pulsed plasma using pulse-modulated microwaves, when the microwaves are activated, free electrons isolate or dissociate other atoms and molecules by energy acquired from the microwaves, thus generating a plasma.

However, when the microwaves are deactivated, free electrons are mostly captured by atoms and molecules in a period on the order of microseconds, producing negative ions. This creates the advantage that charge-up is prevented.

SUMMARY OF THE INVENTION

However, where RF waves and RF bias used for generation of a plasma are time-modulated, the following three problems take place.

First, when only microwaves are pulse-modulated and a continuous RF bias is applied, the peak to peak voltage (hereinafter abbreviated $V_{pp}$) of the RF bias power supply leaps during the period in which microwaves are deactivated, i.e., when the electron temperature drops. If this phenomenon occurs, there is the problem that the selectivity deteriorates.

Secondly, where the RF waves or RF bias for generation of a plasma is turned on and off repeatedly in a pulsed manner, pulses for time-modulating the RF waves for generation of the plasma are synchronized with pulses for time-modulating the RF bias. In practice, the timing at which the output of microwave power is turned on may deviate from the timing at which the output of the RF bias power supply is turned on due to a delay introduced by processing either inside the RF wave power supply for generation of the plasma or inside the RF bias power supply and due to a delay caused by the rise time of the output from a magnetron producing the microwaves.

Furthermore, in a case where the microwave output is pulse-modulated, when the pulse output rises, a rise time is taken until the emission intensity stabilizes. If an RF bias is applied during this period, the peak to peak voltage $V_{pp}$ of the RF bias increases during this period, resulting in adverse effects on the process characteristics. That is, individual devices are different in etching characteristics. The selectivity deteriorates in the same way as for the first problem.

Thirdly, when a plasma etching apparatus is in operation in practice, the mode of operation may be switched consecutively between a continuous output mode in which a continuous output is provided without time modulation and a time modulation output mode in which RF waves for plasma generation and the RF bias are time-modulated.

For example, where the mode of operation is switched from continuous output mode to time modulation output mode, if the RF power supply for plasma generation enters into the time modulation output mode earlier than the RF bias power supply, the output of the RF bias power supply is still in the continuous output mode and so the RF bias voltage is output during OFF period of the pulsed output from the RF power supply for plasma generation. This produces the problem that the peak to peak voltage $V_{pp}$ of the RF bias power supply leaps, in the same way as for the first problem.

Conversely, where the mode of operation is switched from time modulation output mode to continuous output mode, if the RF bias power supply enters into the continuous output mode earlier than the RF power supply for plasma generation, there is the problem that the peak to peak voltage $V_{pp}$ of the RF bias power supply leaps.

In order to solve the foregoing problem, the present invention provides a plasma processing apparatus in which an RF electric power for plasma generation and an RF bias power are time-modulated and which can show stable process performance.

According to one aspect of the present invention, a plasma processing apparatus includes:

a processing chamber for processing a sample with a plasma;

an RF power supply for generating the plasma within the processing chamber;

an RF bias power supply for supplying RF bias power to a sample stage on which the sample is mounted;

a pulse generation unit for creating first pulses for modulating an output from the RF power supply for generating the plasma and second pulses for modulating an output from the RF bias power supply; and a controller that provides control of the processing of the sample with the plasma;

wherein the pulse generation unit creates the first pulses and the second pulses synchronized based on a pulse delay time transmitted from the controller; and wherein the pulse delay time is established to delay the second pulses relative to the first pulses.

According to another aspect of the present invention, a plasma processing apparatus includes:

a processing chamber for processing a sample with a plasma;

an RF power supply for generating the plasma within the processing chamber;

an RF bias power supply for supplying RF bias power to a sample stage on which the sample is mounted;

a pulse generation unit for creating first pulses for modulating an output from the RF power supply for generating the plasma and second pulses for modulating an output from the RF bias power supply; and a controller that provides control of the processing of the sample with the plasma;

wherein, when the mode of operation of the RF power supply for plasma generation and the RF bias power supply is switched from a continuous output mode in which the RF power supply and the RF bias power supply provide their outputs continuously to a pulse modulation mode in which the outputs from the RF power supply and the RF bias power supply are pulse-modulated, the controller provides control to delay switching of the mode of operation of the RF power supply for plasma generation from the continuous output mode to the pulse modulation mode relative to switching of the mode of operation of the RF bias power supply from the continuous output mode to the pulse modulation mode.

According to still another aspect of the present invention, a plasma processing apparatus includes:

a processing chamber for processing a sample with a plasma;

an RF power supply for generating the plasma within the processing chamber;

an RF bias power supply for supplying RF bias power to a sample stage on which the sample is mounted;

a pulse generation unit for creating first pulses for modulating an output from the RF power supply for generating the plasma and second pulses for modulating an output from the RF bias power supply; and a controller that provides control of the processing of the sample with the plasma;

wherein, when the mode of operation of the RF power supply for plasma generation and the RF bias power supply is switched from a pulse modulation mode in which the outputs from the RF power supply and the RF bias power supply are pulse-modulated to a continuous output mode in which the RF power supply and the RF bias power supply provide their outputs continuously, the controller provides control to delay switching of the mode of operation of the RF bias power supply from the pulse modulation mode to the continuous output mode relative to switching of the mode of operation of the RF power supply for plasma generation from the pulse modulation mode to the continuous output mode.

The present invention makes it possible to obtain a plasma processing apparatus in which RF electric power for plasma generation and RF bias power are time-modulated and which can show stable process performance.

Other objects, features and advantages of the invention will become apparent from the following description of the embodiments of the invention taken in conjunction with the accompanying drawings.

BRIEF DESCRIPTION OF THE DRAWINGS

FIG. 8 is a graph showing the relationship between plasma emission level and the peak to peak voltage $V_{pp}$ of an RF bias output.

FIG. 9 is a diagram illustrating a method of setting a pulse delay time using plasma emission.

DETAILED DESCRIPTION OF THE EMBODIMENT

A mode of practice in which the present invention is implemented is hereinafter described with reference to the drawings.

Figure 1:
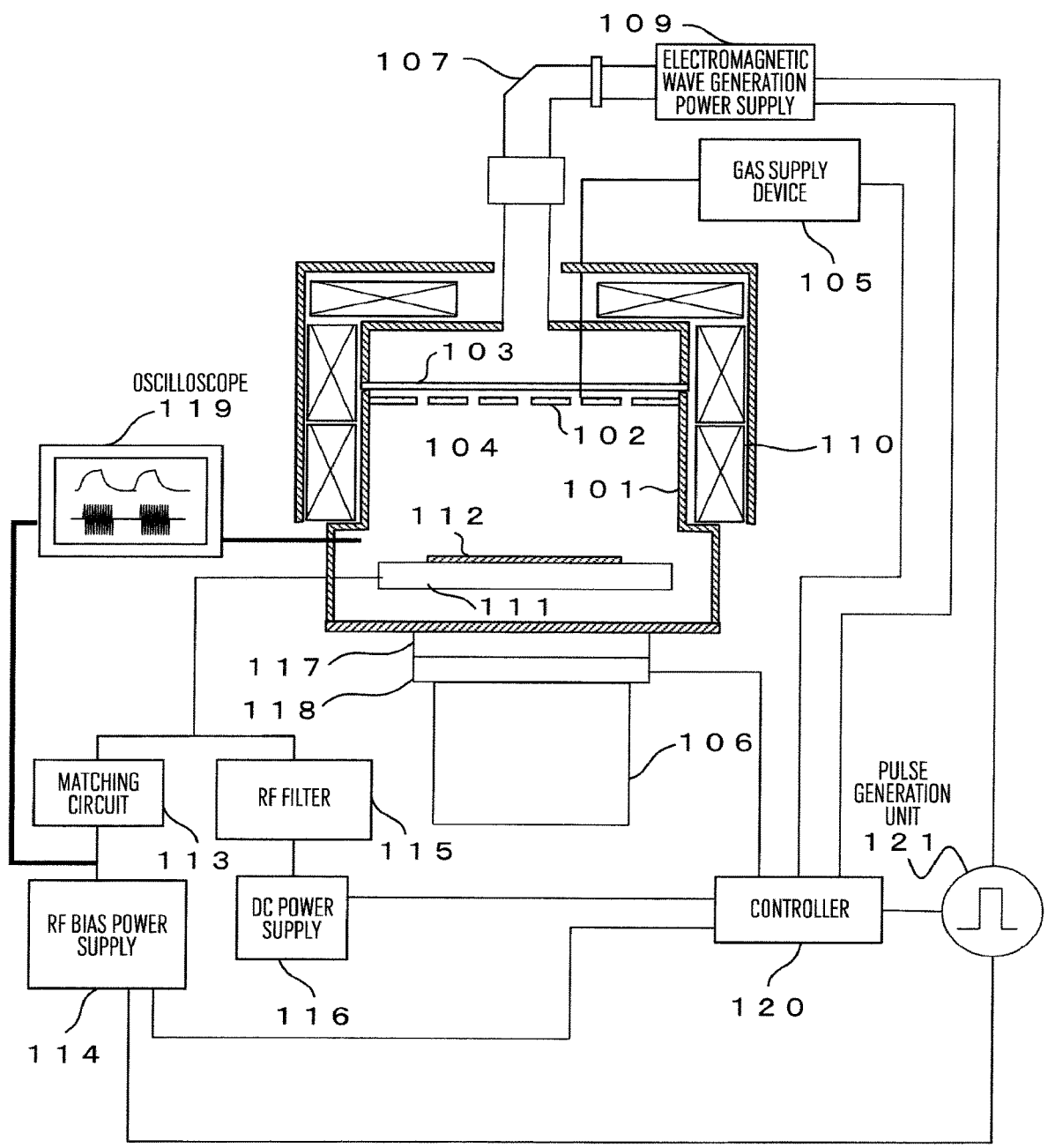
FIG. 1 is a vertical cross section of a microwave ECR plasma etching apparatus associated with one embodiment of the present invention.

FIG. 1 is a schematic vertical cross section of an ECR (electron cyclotron resonance) microwave plasma etching apparatus associated with one embodiment of the present invention.

A shower plate 102, for example, made of quartz and acting to introduce an etchant gas into a vacuum vessel 101 and a dielectric window 103, for example, made of quartz are mounted at higher positions in the vacuum vessel 101 whose upper side is open. The vessel is sealed off, thus forming a processing chamber 104. A gas supply device 105 is connected to the shower plate 102 to permit the etchant gas to flow into the chamber. A vacuum pumping apparatus 106 is connected to the vacuum vessel 101 via an exhaust valve 117 and via a pump speed control valve 118. The interior of the processing chamber 104 is pumped down by opening the exhaust valve 117 and driving the vacuum pumping apparatus 106. Thus, a vacuum state is attained. The pressure inside the processing chamber 104 is adjusted to a desired pressure using the pump speed control valve 118. The etchant gas is introduced from the gas supply device 105 into the processing chamber 104 via the shower plate 102, and is discharged by the vacuum pumping apparatus 106 via the pump speed control valve 118. An electrode 111 which acts as a sample stage for mounting a sample is mounted opposite to the shower plate 102 and located in a lower position within the vacuum vessel 101.

Figure 2:
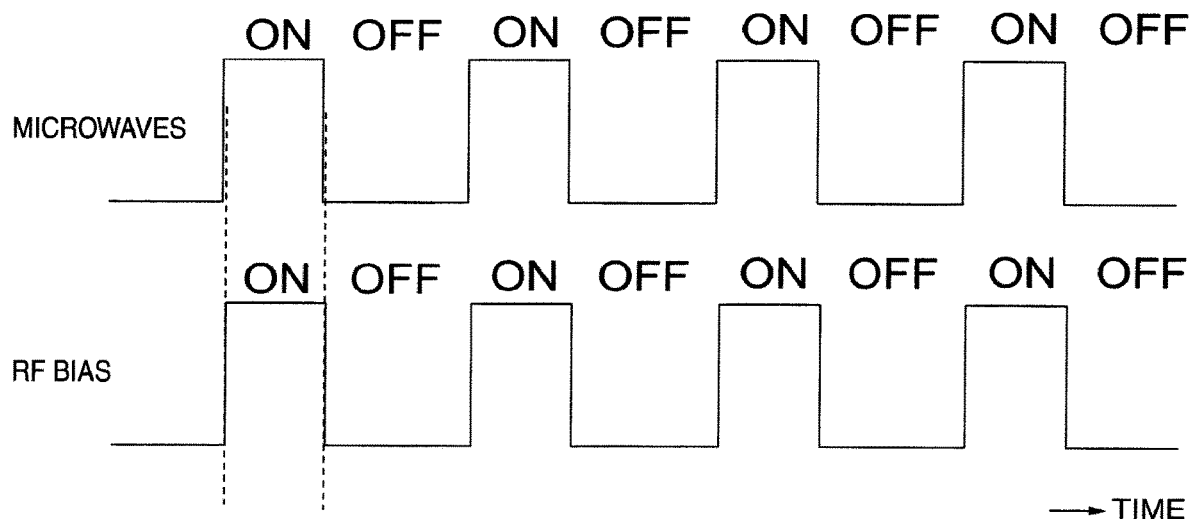
FIG. 2 is a timing chart of pulses used to modulate microwaves and an RF bias.

In order to convey electric power for generating a plasma into the processing chamber 104, a waveguide tube 107 transmitting electromagnetic waves is mounted above the dielectric window 103. The electromagnetic waves transmitted to the waveguide tube 107 are generated from an electromagnetic wave-generating power supply 109 that is an RF power supply for generating the plasma. A pulse generation unit 121 is attached to the power supply 109 for generating the electromagnetic waves. Consequently, microwaves can be modulated in a pulsed manner at a repetition frequency that can be set at will as shown in FIG. 2. In the present embodiment, microwaves of 2.45 GHz are used, though no restriction is imposed on the frequency of electromagnetic waves.

A field-generating coil 110 for producing a magnetic field is mounted outside the processing chamber 104. The electromagnetic waves produced by the power supply 109 for generation of electromagnetic waves interact with the magnetic field developed by the field-generating coil 110 to thereby generate a high-density plasma in the processing chamber 104. This plasma etches a wafer 112 being the sample placed on the sample mounting electrode 111. Since the shower plate 102, sample mounting electrode 111, field-generating coil 110, exhaust valve 117, pump speed control valve 118, and wafer 112 are disposed coaxially about the center axis of the processing chamber 104, the etchant gas, radicals and ions generated by the plasma, and reaction products generated by the etching flow toward and away from the wafer 112 in a coaxial manner. This coaxial arrangement is useful in bringing the etch rate and the uniformity of the shape obtained by the etching across the wafer plane closer to axial symmetry and improving the uniformity of the processing of the wafer.

The surface of the sample mounting electrode 111 is coated with a sprayed film (not shown) and connected to a DC power supply 116 via an RF filter 115.

Furthermore, an RF bias power supply 114 is connected to the sample mounting electrode 111 via a matching circuit 113. The pulse generation unit 121 is attached to the RF bias power supply 114. As a result, intermittent RF electric power that is similarly time-modulated as shown in FIG. 2 can be selectively supplied to the sample mounting electrode 111. In the present embodiment, radio-frequency waves of 400 kHz are used, though no restriction is placed on the frequency of the RF bias.

A controller 120 for controlling the etching process using the aforementioned ECR microwave plasma etching apparatus controls various etching parameters including the repetition frequency at which the electromagnetic wave generation power supply 109, RF bias power supply 114, and pulse generation unit 121 are turned on and off in a pulsed manner, duty ratio, flow rate of gas for performing the etching, process pressure, electromagnetic wave power, RF bias power, and coil current in response to the input made through an input unit (not shown). The duty ratio is the ratio of the duration of the ON period to the duration of one cycle of pulse.

The functions of the controller 120 for two cases are described below by referring to FIG. 2. In one case, time-modulated, intermittent electromagnetic waves are generated from the power supply 109 for generation of electromagnetic waves. In the other case, time-modulated, intermittent RF electric power is supplied from the RF bias power supply 114 to the sample mounting electrode 111.

Time information is set by the controller 120 into the pulse generation unit 121, the time information including the repetition frequency at which the electromagnetic wave generation power supply 109 and the RF bias power supply 114 are modulated in a pulsed manner, the duty ratio, the timing at which the electromagnetic wave generation power supply 109 is turned on, and timing at which the RF bias power supply 114 is turned on. The power supply 109 for generation of electromagnetic waves generates electromagnetic waves at ON and OFF timing as shown in FIG. 2. Similarly, the RF bias power supply 114 is turned on and off at timings as shown in FIG. 2 to generate RF waves. Various methods are available as the method of generating pulses which are turned on and off as described previously. Also, various methods are available as a synchronization control method. Their detail description is omitted here but their one example is given below.

A method of producing the stable output of the peak to peak voltage $V_{pp}$ of the RF bias and securing high selectivity in a case where the electromagnetic wave generation power supply 109 and the RF bias power supply 114 are modulated in synchronism is next described.

The pulse generation unit 121 sends pulse information to the electromagnetic wave generation power supply 109, the pulse information including output timing, repetition frequency, and duty ratio commanded from the controller 120. Furthermore, the pulse generation unit 121 sends the pulse information indicating the output timing, repetition frequency, and duty ratio commanded from the controller 120 to the RF bias power supply 114. The power supply 109 for generation of electromagnetic waves applies a high voltage to a magnetron contained therein at ON and OFF timing given from the pulse generation unit 121 to generate microwaves. Under actual environments, the rising of the microwave output pulses may be delayed due to a delay introduced by processing performed inside the power supply 109 for generation of electromagnetic waves and due to a delay in the rise time of the magnetron output.

Figure 3:
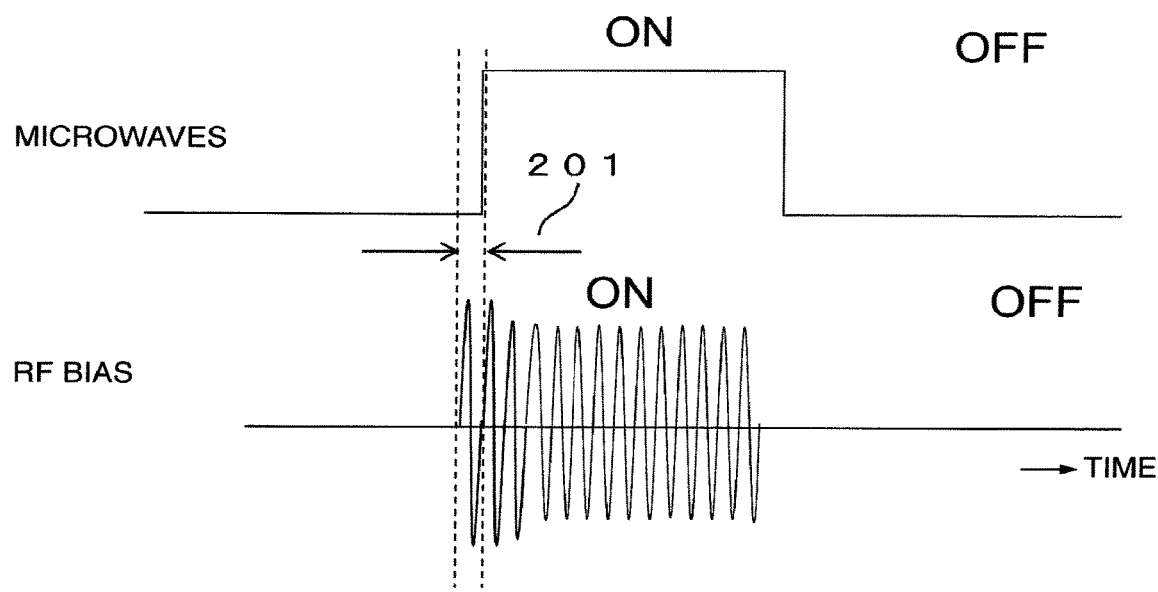
FIG. 3 is a pulse waveform produced in a case where the output of pulses for modulating microwaves is delayed relative to pulses for modulating an RF bias.

In such a case, there is a possibility that the peak-to-peak voltage $V_{pp}$ of the RF bias will increase during the delay time 201 of the microwave output as shown in FIG. 3, thus deteriorating the selectivity as described previously. As a solution, the controller 120 sends information about the output timing of the electromagnetic wave generation power supply 109, repetition frequency, and duty ratio and information about the output timing of the RF bias power supply 114, repetition frequency, and duty ratio to the pulse generation unit 121 such that the output timing of the electromagnetic wave generation power supply 109 precedes the output timing of the RF bias power supply 114.

Figure 4:
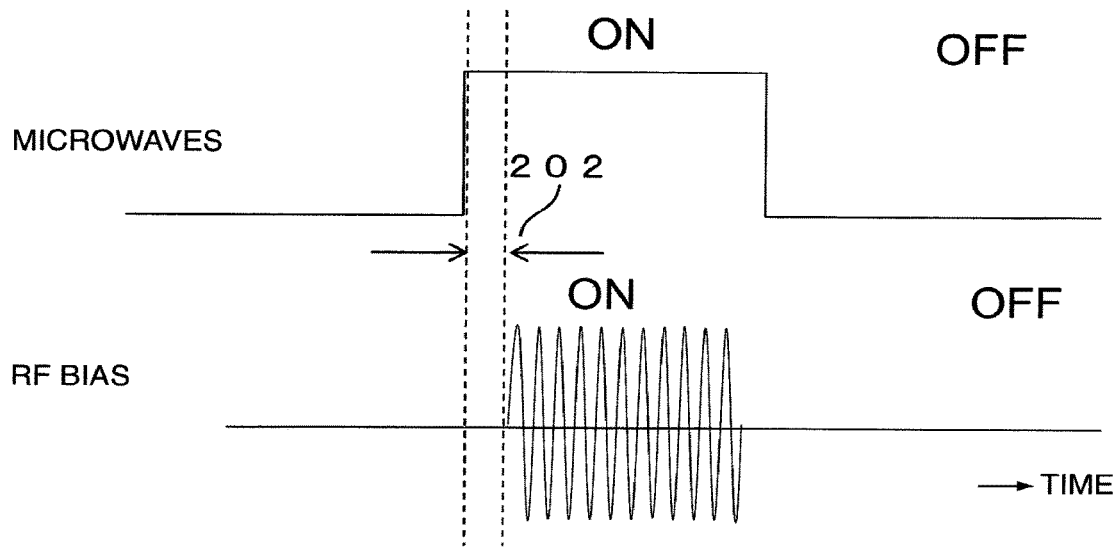
FIG. 4 is a timing chart of a pulse for modulating microwaves and an RF bias in accordance with the present invention.

Under an instruction from the controller 120, the pulse generation unit 121 can delay the output timing of the RF bias power supply 114 relative to the output timing (microwaves) of the electromagnetic wave generation power supply 109 by a pulse delay time 202 as shown in FIG. 4. Consequently, the RF bias that is stable at all times is applied. Hence, the selectivity can be prevented from deteriorating.

Means for adjusting the ON and OFF timings of the power supply 109 for generation of electromagnetic waves and of the RF bias power supply 114 are next described by referring again to FIG. 1.

First, the controller 120 sets the information for modulating the output from the electromagnetic wave generation power supply 109 and the output from the RF bias power supply 114 in a pulsed manner into the pulse generation unit 121, the information including information about the repetition frequency, duty ratio, the timing at which the electromagnetic wave generation power supply 109 is turned on and off, and the timing at which the RF bias voltage 114 is turned on and off. The controller checks the waveform of the output from the RF bias power supply 114 when modulated signals are delivered from the electromagnetic wave generation power supply 109 and the RF bias power supply 114 synchronously.

The output waveform can be checked by picking up the output waveform from the RF bias power supply 114 using a directional coupler, for example. The output waveform picked up is displayed on an oscilloscope 119 and thus it is possible to check whether the peak to peak voltage $V_{pp}$ of the output from the RF bias power supply 114 is stable. If $V_{pp}$ of the output from the RF bias voltage 114 is not constant, information about pulses obtained by delaying the leading edge of the output from the RF bias power supply 114 by the pulse delay time 202 of FIG. 4 is set into the pulse generation unit 121 from the controller 120 so that the output of stable $V_{pp}$ is obtained. Thus, the ON and OFF timings for stabilizing the $V_{pp}$ of the output from the RF bias power supply can be adjusted easily. That is, the pulse delay time 202 is so set that peak to peak voltage $V_{pp}$ of the output from the RF bias power supply 114 is stabilized.

Figure 5:
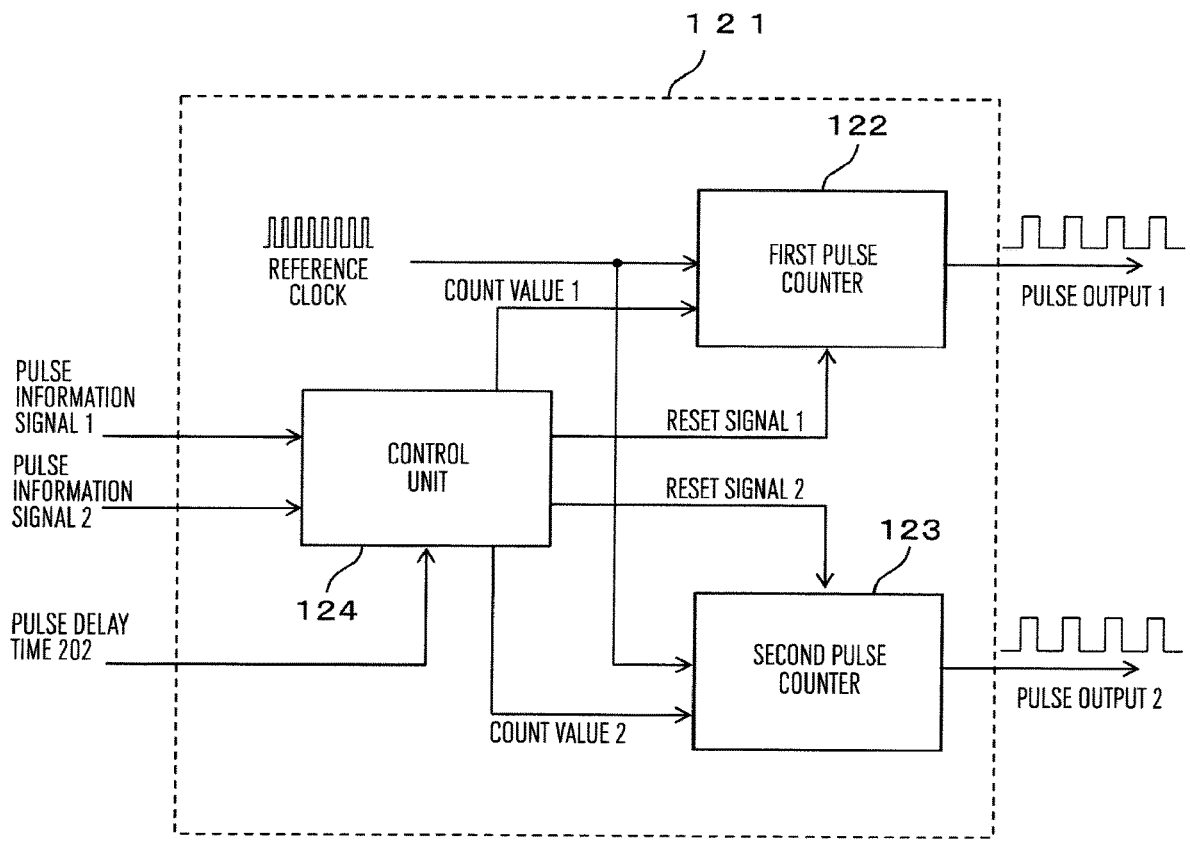
FIG. 5 is a block diagram of a pulse generation unit.

The above-described method of delaying the timing at which the modulated pulse delivered from the RF bias power supply 114 rises is now described by referring to FIG. 5. The pulse generation unit 121 incorporates a reference clock generator producing reference clock signals which are applied to a first pulse counter 122 and a second pulse counter 123, respectively.

The first pulse counter 122 generates pulse output 1 being pulses for time-modulating the power supply 109 for generation of electromagnetic waves. The second pulse counter 123 generates pulse output 2 being pulses for time-modulating the RF bias power supply 114. The reference clock signals are pulse waveforms providing a basis for generating the pulse outputs 1 and 2.

A control unit 124 incorporated in the pulse generation unit 121 receives pulse information signal 1 (e.g., pulse frequency and duty ratio) for the power supply 109 for generation of electromagnetic waves, pulse information signal 2 (e.g., pulse frequency and duty ratio) for the RF bias voltage 114, and the pulse delay time 202 being a delay time of the pulse output 2 relative to the pulse output 1 from the controller 120.

In response to the received pulse information signal 1, pulse information signal 2, and pulse delay time 202, the control unit 124 sends count value 1 and reset signal 1 to the first pulse counter 122 and sends count value 2 and reset signal 2 to the second pulse counter 123.

The reset signals 1 and 2 are used to reset the count values 1 and 2 or to adjust the pulse delay time in a case where the pulse frequency and the duty ratio are modified. The count values 1 and 2 are used to generate pulses having desired frequencies and duty ratios from a reference clock signal.

The first pulse counter 122 creates the pulse output 1 having desired frequency and duty ratio from the count value 1 and reset signal 1 sent from the control unit 124 and outputs the pulse output 1 to the power supply 109 for generation of electromagnetic waves, thus pulse-modulating the microwaves. Similarly, the second pulse counter 123 creates the pulse output 2 having desired frequency and duty ratio from the count value 2 and reset signal 2 sent from the control unit 124 and outputs the pulse output 2 to the RF bias power supply 114, thus pulse-modulating the RF bias.

Figure 6A:
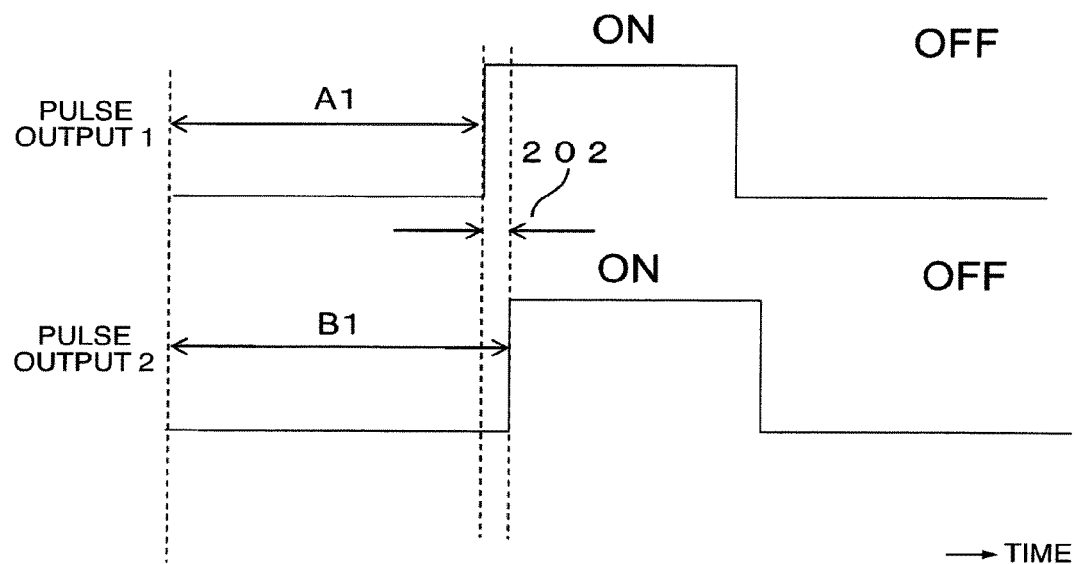
FIG. 6A is a diagram showing one example of delay time of each of pulse output 1 and pulse output 2.

The pulse output 1 and pulse output 2 created from the first pulse counter 122 and the second pulse counter 123, respectively, are delayed from a certain reference time by times A1 and B1, respectively, as shown in FIG. 6A. The time B1 is longer than the time A1 by the pulse delay time 202 received by the control unit 124.

Figure 6B:
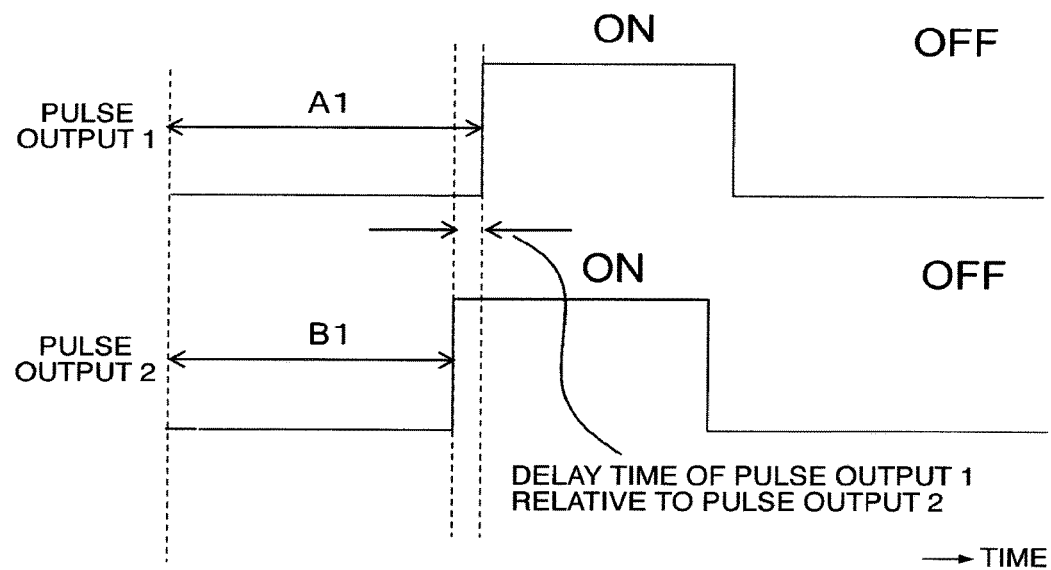
FIG. 6B is a diagram showing one example of delay time of each of pulse output 1 and pulse output 2.

In this way, the pulse output 2 is delayed relative to the pulse output 1 by the pulse delay time 202, and the pulse outputs 1 and 2 are synchronized. Conversely, the pulse output 1 can be delayed relative to the pulse output 2 by the time equal to the difference between the times A1 and B1 by making the time A1 longer than the time B1 as shown in FIG. 6B.

Figure 7:
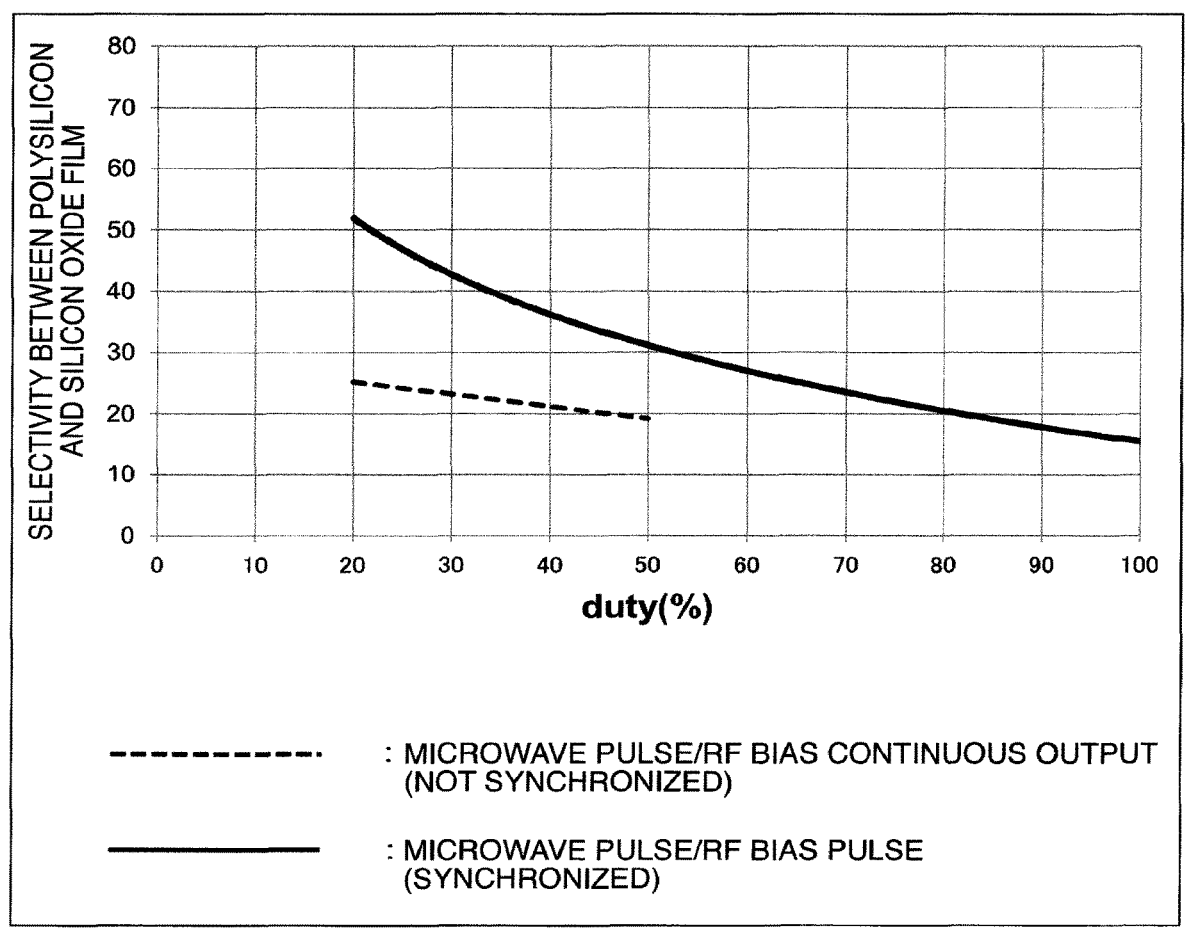
FIG. 7 is a graph showing the selectivities of polysilicon films to silicon oxide films obtained according to the present invention.

A wafer whose whole surface was a polysilicon film and another wafer whose whole surface was a silicon oxide film were etched under conditions listed in Table 1 for two cases. In one case, the electromagnetic wave generation power supply 109 and the RF bias power supply 114 were pulse-modulated synchronously. In the other case, only the power supply 109 for generation of electromagnetic waves was pulse-modulated. Calculated selectivities are shown in FIG. 7, where "%" of the horizontal axis indicates the duty ratio of pulse modulation of each of the electromagnetic wave generation power supply 109 and the RF bias power supply 114.

TABLE 1

| HBr gas | 150 ml/min |
| Ar gas | 30 ml/min |
| process pressure | 0.4 Pa |

TABLE 1-continued

| RF bias power | 100 W |
| frequency of microwave modulation pulses | 1 kHz |
| frequency of RF bias modulation pulses | 1 kHz or continuous bias (no modulation) |

FIG. 7 shows that the selectivity of the polysilicon film relative to the silicon oxide film was higher in the case where the electromagnetic wave generation power supply 109 and the RF bias power supply 114 were time-modulated synchronously than in the case where only microwaves generated from the electromagnetic wave generation power supply 109 were intermittently time-modulated. Furthermore, the selectivity was improved with reducing the duty ratio.

In the present embodiment, the pulse delay time 202 is so set that the peak to peak voltage $V_{pp}$ of the output from the RF bias power supply 114 stabilizes during this delay time 202. The present invention is not restricted to this method of setting the pulse delay time. Another method of setting the pulse delay time is described below.

First, the controller 120 sets various sets of information (including repetition frequency, duty ratio, the ON and OFF timing of the power supply 109 for generation of electromagnetic waves, and the ON and OFF timing of the RF bias power supply 114 for modulating the outputs from the power supply 109 and from the RF bias power supply 114 in a pulsed manner) into the pulse generation unit 121. Where the pulse-modulated output from the electromagnetic wave generation power supply 109 and the pulse-modulated output from the RF bias power supply 114 are synchronized, the emission level obtained when the microwave output rises gradually increases. The electron temperature within a so-called plasma draws a similar curve. Therefore, as shown in FIG. 8, if an RF bias is applied during a period 301 in which the plasma emission stabilizes, the peak to peak voltage $V_{pp}$ of the RF bias output increases as shown in FIG. 8. Consequently, as described previously, the selectivity deteriorates.

Therefore, the control portion 120 first sets the various factors for modulating the outputs from the electromagnetic wave generation power supply 109 and the RF bias power supply 114 in a pulsed manner into the pulse generation unit 121, the factors including the repetition frequency, duty ratio, the timing at which the electromagnetic wave generation power supply 109 is turned on and off, and the timing at which the RF bias voltage 114 is turned on and off. The controller checks the plasma emission level when the pulse-modulated outputs from the electromagnetic wave generation power supply 109 and the RF bias power supply 114 are synchronized. The plasma emission level is detected using photodiodes. The detected emission of the plasma is checked by displaying the emission on the oscilloscope 119.

The time from the moment the power supply 109 for generation of electromagnetic waves is turned on until the stabilized plasma emission level 302 is detected is defined as the pulse delay time 202. As shown in FIG. 9, the peak to peak voltage $V_{pp}$ of the output from the RF bias power supply can be stabilized by delaying the timing of the rising of the modulated pulse output from the RF bias power supply 114 by the pulse delay time 202.

Methods of setting the pulse delay time were described above. Besides, the pulse delay time may be experimentally found in advance.

An example of the optimum method employed when the output modes (i.e., pulse modulation mode and continuous output mode (no pulse modulation)) of the electromagnetic wave generation power supply 109 and the RF bias power supply 114 are switched consecutively is next described.

First, the control portion 120 gives an instruction to the electromagnetic wave generation power supply 109 and RF bias power supply 114 such that they provide their outputs in the continuous output mode. The power supply 109 and the RF bias power supply 114 operate in the continuous output mode commanded from the controller 120 during an instructed period.

When the output mode of the electromagnetic wave generation power supply 109 and the RF bias power supply 114 is consecutively switched to the pulse modulation mode at the next step, the controller 120 sets various parameters (i.e., repetition frequency at which the outputs from the power supply 109 and power supply 114 are modulated in a pulsed manner, duty ratio, ON and OFF timing of the electromagnetic wave generation power supply 109, and ON and OFF timing of the RF bias power supply 114) into the pulse generation unit 121. The pulse generation unit 121 outputs instructed desired pulses to the power supply 109 and power supply 114 under the instruction from the controller 120.

Figure 10A:
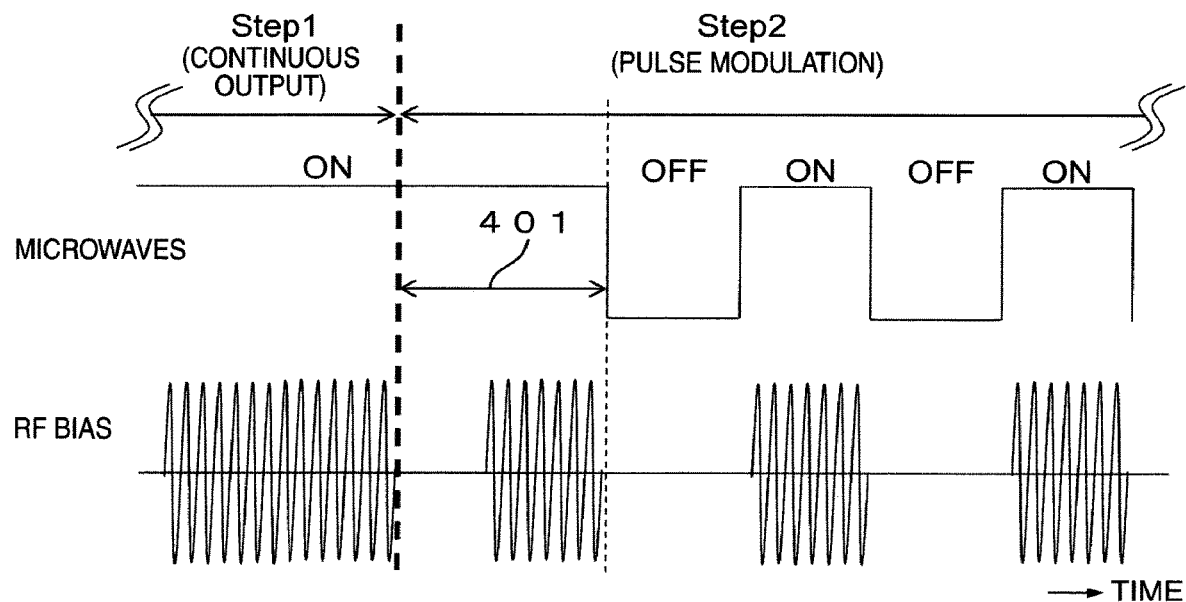
FIG. 10A is a diagram illustrating a switch from a continuous output mode to a pulse modulation mode.

The control portion 120 then provides control to delay the timing at which the power supply 109 for generation of electromagnetic waves makes a transition to the pulse modulation mode relative to the timing at which the RF bias power supply 114 makes a transition to the pulse modulation mode by a period 401 permitting the mode transition mode switching), using an operational sequence as shown in FIG. 10A.

This control provided by the control portion 120 makes it possible to switch the mode of operation of the RF bias power supply 114 from continuous output mode to pulse modulation mode earlier than the switching of the mode of the electromagnetic wave generation power supply 109. Consequently, the peak to peak voltage $V_{pp}$ of the output of the RF bias can be stabilized.

The manner in which the mode of operation is switched from pulse modulation mode to continuous output mode is next described. First, the controller 120 gives an instruction for providing an output in the pulse modulation mode to the electromagnetic wave generation power supply 109 and the RF bias power supply 114. The controller sets various parameters into the pulse generation unit 121 to modulate the outputs from the electromagnetic generation power supply 109 and RF bias power supply 114 in a pulsed manner, the parameters including repetition frequency, duty ratio, ON and OFF timing of the electromagnetic wave generation power supply 109, and ON and OFF timing of the RF bias power supply 114. The power supply 109 and power supply 114 operate in the pulse modulation mode commanded from the controller 120 during an instructed period.

Figure 10B:
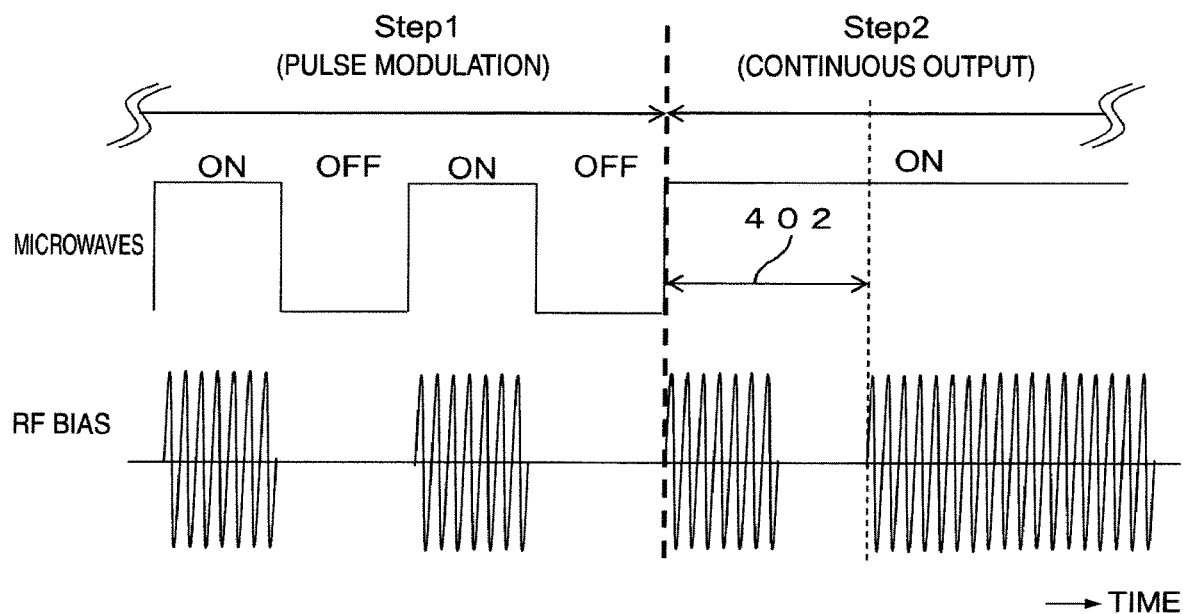
FIG. 10B is a diagram illustrating a switch from the pulse modulation mode to the continuous output mode.

At the next step, when the mode of operation of the electromagnetic wave generation power supply 109 and the RF bias power supply 114 is consecutively switched to the continuous output mode, the controller 120 provides control to delay the timing at which the RF bias power supply 114 is switched from pulse modulation mode to continuous output mode relative to the timing at which the electromagnetic wave generation power supply 109 is switched from pulse modulation mode to continuous output mode by a delay time 402 permitting switching to the continuous output mode, using the operational sequence as shown in FIG. 10B.

As a result of this control provided by the controller 120, the switching of the mode of operation of the electromagnetic wave generation power supply 109 from pulse modulation mode to continuous output mode can be done earlier than the switching of the mode of operation of the RF bias power supply 114 and so the peak to peak voltage $V_{pp}$ of the output of the RF bias can be stabilized.

As described so far, the present invention provides a plasma processing apparatus which can time-modulate electromagnetic waves used for generation of a plasma and an RF bias and which can obtain process performance achieving stable selectivity by controlling the repetition frequency and duty ratio for the pulse-like modulation of the power supply for generation of electromagnetic waves, the repetition frequency and duty ratio for the pulse-like modulation of the RF bias power supply, and the ON and OFF timings of these power supplies.

Furthermore, the present invention provides a plasma processing apparatus using a power supply for generation of a plasma and an RF bias power supply. In this apparatus, the power supply for the plasma generation is operated in a continuous output mode or in a pulse modulation mode. The RF bias power supply is also operated in the continuous output mode or in the pulse modulation mode. When the mode of operation of the plasma generation power supply and the RF bias power supply is switched from continuous output mode to pulse modulation mode consecutively, control is provided to delay the timing at which the mode of operation of the power supply for plasma generation is switched from continuous output mode to pulse modulation mode relative to the timing at which the mode of operation of the RF bias power supply is switched from continuous output mode to pulse modulation mode. When the mode of operation of the power supply for plasma generation and the RF bias power supply is switched from pulse modulation mode to continuous output mode consecutively, control is provided to delay the timing at which the mode of operation of the RF bias voltage is switched from pulse modulation mode to continuous output mode relative to the timing at which the mode of operation of the power supply for plasma generation is switched from pulse modulation mode to continuous output mode. This plasma processing apparatus can obtain process performance that can achieve stable selectivity.

In the above description of the present embodiment, the timings at which the electromagnetic wave generation power supply 109 and the RF bias power supply 114 are pulse-modulated using pulse frequency and duty ratio. The present invention can also be implemented by setting ON and OFF times of a signal interfacing between the controller 120 and the pulse generation unit 121.

Furthermore, in the above description of the present embodiment, the electromagnetic wave generation power supply 109 and the RF bias power supply 114 are identical in pulse modulation frequency and duty ratio. The present invention can also be implemented in a case where these two power supplies are different in pulse modulation frequency and duty ratio of pulse modulation.

In addition, in the above description of the present embodiment, an ECR (electron cyclotron resonance) plasma source is used as the above-described plasma source. It will be understood that the present invention can also be applied with equal utility to a plasma processing apparatus using other method of generating a plasma such as an inductively coupled plasma (ICP) source or a capacitively coupled plasma source.

Further, in the above description of the present embodiment, on-off pulse modulation is employed. In the present invention, two-valued pulses each showing high and low values may also be used.

The invention claimed is:

1. A plasma processing apparatus comprising:
a processing chamber for processing a sample with a plasma;
a first RF power supply for providing a first RF power to generate the plasma within the processing chamber;
a second RF power supply for providing a second RF power to a sample stage on which the sample is mounted;
a pulse generation unit for creating first pulses for modulating the first RF power and second pulses for modulating the second RF power; and
a controller configured to control the pulse generation unit;
wherein, when the mode of operation of the first RF power supply and the second RF power supply is switched from a pulse modulation mode in which outputs from the first RF power supply and the second RF power supply are pulse-modulated to a continuous output mode in which the first RF power supply and the second RF power supply provide their outputs continuously, said controller is configured to switch the mode of operation of the second RF power supply from the pulse modulation mode to the continuous output mode after a predetermined delay time from switching of the mode of operation of the first RF power supply from the pulse modulation mode to the continuous output mode, and is thereby configured to stabilize a peak to peak voltage of the second RF power supply.

2. A plasma processing apparatus comprising:
a processing chamber for processing a sample with a plasma;
a first RF power supply for providing a first RF power to generate the plasma within the processing chamber;
a second RF power supply for providing a second RF power to a sample stage on which the sample is mounted;
a pulse generation unit for creating first pulses for modulating the first RF power and second pulses for modulating the second RF power; and
a controller configured to control the pulse generation unit;
wherein, when the mode of operation of the first RF power supply and the second RF power supply is switched from a pulse modulation mode in which outputs from the first RF power supply and the second RF power supply are pulse-modulated to a continuous output mode in which the first RF power supply and the second RF power supply provide their outputs continuously, said controller is configured to switch the mode of operation of the second RF power supply from the pulse modulation mode to the continuous output mode after a predetermined delay time from switching of the mode of operation of the first RF power supply from the pulse modulation mode to the continuous output mode, and
the predetermined delay time is a delay time to stabilize a peak to peak voltage of the second RF power supply.

* * * * *